United States Patent
Lee et al.

(10) Patent No.: US 7,781,290 B2
(45) Date of Patent: Aug. 24, 2010

(54) COMPLEMENTARY METAL-OXIDE SEMICONDUCTOR (CMOS) DEVICES INCLUDING A THIN-BODY CHANNEL AND DUAL GATE DIELECTRIC LAYERS AND METHODS OF MANUFACTURING THE SAME

(75) Inventors: Sung-young Lee, Gyeonggi-do (KR); Sung-min Kim, Incheon Metropolitan (KR); Sung-dae Suk, Seoul (KR); Eun-jung Yun, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/108,304

(22) Filed: Apr. 23, 2008

(65) Prior Publication Data
US 2008/0233693 A1 Sep. 25, 2008

Related U.S. Application Data

(62) Division of application No. 11/247,939, filed on Oct. 11, 2005, now abandoned.

(30) Foreign Application Priority Data
Oct. 11, 2004 (KR) ...................... 10-2004-0081111

(51) Int. Cl.
 *H01L 21/8238* (2006.01)
(52) U.S. Cl. ...................... 438/275; 438/268; 438/284; 257/E21.014; 257/E21.131; 257/E21.442; 257/E21.632; 257/E21.693
(58) Field of Classification Search ................ 438/275, 438/283, 284, 268; 257/E21.014, 442, 632, 257/693, 131
See application file for complete search history.

(56) References Cited

U.S. PATENT DOCUMENTS 5,965,914 A 10/1999 Miyamoto (Continued)

FOREIGN PATENT DOCUMENTS

JP 07-135325 5/1995

(Continued)

OTHER PUBLICATIONS

Notice to Submit a Response for Korean Patent Application No. 10-2004-0081111 mailed on Jan. 31, 2006.

*Primary Examiner*—Kiesha R Bryant
*Assistant Examiner*—Minchul Yang
(74) *Attorney, Agent, or Firm*—Myers Bigel Sibley & Sajovec, P.A.

(57) ABSTRACT

A complementary metal-oxide semiconductor (CMOS) device includes an NMOS thin body channel including a silicon epitaxial layer. An NMOS insulating layer is formed on a surface of the NMOS thin body channel and surrounds the NMOS thin body channel. An NMOS metal gate is formed on the NMOS insulating layer. The CMOS device further includes a p-channel metal-oxide semiconductor (PMOS) transistor including a PMOS thin body channel including a silicon epitaxial layer. A PMOS insulating layer is formed on a surface of and surrounds the PMOS thin body channel. A PMOS metal gate is formed on the PMOS insulating layer. The NMOS insulating layer includes a silicon oxide layer and the PMOS insulating layer includes an electron-trapping layer, the NMOS insulating layer includes a hole trapping dielectric layer and the PMOS insulating layer includes a silicon oxide layer, or the NMOS insulating layer includes a hole-trapping dielectric layer and the PMOS insulating layer includes an electron-trapping dielectric layer.

29 Claims, 13 Drawing Sheets

U.S. PATENT DOCUMENTS

| | | |
|---|---|---|
| 6,653,698 B2 | 11/2003 | Lee et al. |
| 7,112,832 B2 | 9/2006 | Orlowski et al. |
| 2004/0063286 A1 | 4/2004 | Kim et al. |
| 2005/0098839 A1* | 5/2005 | Lee et al. .................... 257/410 |
| 2005/0224897 A1* | 10/2005 | Chen et al. .................. 257/410 |
| 2005/0282329 A1 | 12/2005 | Li |

FOREIGN PATENT DOCUMENTS

| | | |
|---|---|---|
| KR | 10-2002-0056140 | 7/2002 |

\* cited by examiner

COMPLEMENTARY METAL-OXIDE SEMICONDUCTOR (CMOS) DEVICES INCLUDING A THIN-BODY CHANNEL AND DUAL GATE DIELECTRIC LAYERS AND METHODS OF MANUFACTURING THE SAME

CROSS REFERENCE TO RELATED APPLICATION

This application claims priority to Korean Patent Application No. 10-2004-0081111, filed on Oct. 11, 2004 in the Korean Intellectual Property Office and U.S. patent application Ser. No. 11/247,939, filed on Oct. 11, 2005, now abandoned, the disclosures of which are hereby incorporated herein by reference in their entirety.

BACKGROUND OF THE INVENTION

1. Field of the Invention

The present invention relates to semiconductor devices and methods of manufacturing the same, and, more particularly, to complementary metal-oxide semiconductor (CMOS) devices and methods of manufacturing the same.

2. Description of the Related Art

Typically, a gate of metal-oxide semiconductor field effect transistors (MOSFETs) comprises polysilicon. However, because the design rule of complementary metal-oxide semiconductor (CMOS) devices is typically less than 100 nm, the use of a polysilicon gate may result in gate depletion and boron (Br) penetration. Recently, high-k materials have been used to form gate-insulating layers. However, most high-k materials and polysilicon typically cannot be used together. To solve this problem, a metal gate may be used in sub-100 nm CMOS devices.

In a CMOS device including an n-channel metal-oxide semiconductor (NMOS) transistor and a p-channel metal-oxide semiconductor (PMOS) transistor, the NMOS and PMOS transistors may have a symmetric threshold voltage. When a CMOS device is designed for high performance, the NMOS transistor and the PMOS transistor included therein may have a threshold voltage as low as ±0.2 V. To manufacture such a CMOS device with a symmetric threshold voltage, much research has been conducted.

The threshold voltage of the NMOS transistor and the PMOS transistor can be controlled by changing the concentration of a dopant for channels of the NMOS and PMOS transistors. The doping concentration of the channels can be adjusted using an ion implantation process. However, ion implantation may be used only for a planar transistor including a bulk substrate. That is, ion implantation typically cannot be used for 3-dimensional transistors, such as a transistor with a thin body channel. A transistor with a thin body channel may be referred to as a transistor with a thin channel region. Examples of transistors with thin channel regions include double gate (DG) electric field effect transistors, FinFETs, GAA electric field effect transistors, multi bridge channel electric field effect transistors (see U.S. Publication No. 2004/0063286 A1) and the like. The channel region of a transistor with a thin channel is separated from a bulk substrate, and is formed as a thin layer. Therefore, changing the doping concentration of the channel region by using an ion implantation process typically cannot be used to control the threshold voltage of the NMOS transistor and the PMOS transistor.

When a metal gate is used, to obtain a symmetric threshold voltage in the NMOS and PMOS transistors, the work function of the metal gate of the NMOS transistor may be similar to the work function of an $n^+$ polysilicon gate and the work function of the metal gate of the PMOS transistor to a $p^+$ polysilicon gate. For example, a dual metal gate can be used to make the work function of the metal gate similar to that of a polysilicon gate. For example, a CMOS device including a dual metal gate is disclosed in "Dual-Metal Gate CMOS Technology with Ultrathin silicon Nitride Gate Dielectric", IEEE electron Device Letters, Vol. 22, No. 5, May 2001, pp. 227-229 by Yee-chia Yeo et al., in which an NMOS transistor has a gate electrode comprising Ti and a PMOS transistor has a gate electrode comprising Mo. However, the use of different materials to form gates makes the manufacturing process more complex.

A possible solution is forming the gates of the NMOS transistor and the PMOS transistor using identical materials with different work functions. For example, a CMOS device including a gate comprising Mo is disclosed in "Metal Gate Work Function Adjustment for Future CMOS Technology", 2001 symposium on VLSI Technology digest of Technical Papers, pp. 45-46 by Qiang Lu, et. al. In this case, a gate of a PMOS transistor comprises (110)-Mo, and a gate of an NMOS transistor comprises (110)-Mo in which nitrogen ions are implanted. When nitrogen ions are implanted into (110)-Mo, the work function of the metal decreases. Therefore, a CMOS device with a symmetric threshold voltage can be manufactured using a single metal.

In addition, a CMOS device including a gate comprising TiNx is disclosed in "A Dual-Metal Gate CMOS Technology Using Nitrogen-Concentration-Controlled TiNx Film", IEEE Transactions on Electron Devices, Vol. 48, No. 10, October 2001, pp. 2363-2369 by Hitoshi Wakabayashi, et. al. In this case, threshold voltages of an NMOS transistor and a PMOS transistor are controlled using a low-power nitrogen ion implantation process by changing a nitrogen concentration of a TiNx gate electrode. In addition, because the nitrogen concentration of the TiNx gate electrode can be controlled, a CMOS device can be manufactured using a conventional NMOS transistor manufacturing technique.

However, the CMOS devices and methods of manufacturing the same discussed in the above-mentioned references typically cannot be used for 3-dimensional transistors with a thin body channel. For example, a multi-bridge channel field effect transistor (MBCFET) typically includes a gate electrode surrounding a channel, and a DG FET typically includes a gate electrode formed on a bottom surface of a channel as well as a gate electrode formed on a top surface of a channel. Therefore, whether the gate electrode comprises (110)-Mo or TiNx, a work function of the gate electrode, that is, a threshold voltage of the transistor, generally cannot be controlled by the nitrogen ion implanting process. This problem may also occur when a thin channel transistor with other types is used.

Further, it is generally difficult to form the gate of the thin channel transistor using the above-mentioned metal materials. That is, currently, Ta-nitride, Mo, Hf, Titanium-nitride, or the like is introduced as a metal gate material and, in particular, refractory metal materials typically cannot be patterned to have a desired profile by using dry etching and chemical mechanical polishing (CMP). Thus, metal gate materials, which are suitable for the known structures and manufacturing methods of conventional CMOS devices, may be limited.

SUMMARY OF THE INVENTION

According to some embodiments of the present invention, a complementary metal-oxide semiconductor (CMOS) device includes an NMOS thin body channel including a silicon epitaxial layer. An NMOS insulating layer is formed on a surface of the NMOS thin body channel and surrounds the NMOS thin body channel. An NMOS metal gate is formed on the NMOS insulating layer. The CMOS device further includes a p-channel metal-oxide semiconductor (PMOS) transistor including a PMOS thin body channel including a silicon epitaxial layer. A PMOS insulating layer is formed on a surface of and surrounds the PMOS thin body channel. A PMOS metal gate is formed on the PMOS insulating layer. The NMOS insulating layer includes a silicon oxide layer and the PMOS insulating layer includes an electron-trapping layer, the NMOS insulating layer includes a hole trapping dielectric layer and the PMOS insulating layer includes a silicon oxide layer, or the NMOS insulating layer includes a hole-trapping dielectric layer and the PMOS insulating layer includes an electron-trapping dielectric layer.

The electron-trapping dielectric layer may include $Al_2O_3$ layer. The PMOS insulating layer may further include a PMOS interface layer interposed between the PMOS thin body channel and the $Al_2O_3$ layer.

The hole-trapping dielectric layer may include an $HfO_2$ layer. The NMOS insulating layer may further include an NMOS interface layer interposed between the surface of the NMOS thin body channel and the $HfO_2$ layer.

Each of the NMOS thin body channel and the PMOS thin body channel may include an undoped silicon epitaxial layer or an N-doped silicon epitaxial layer.

The NMOS metal gate and the PMOS metal gate may be made from identical materials, such as TiN or the like, or different materials.

An NMOS source/drain region may be formed next to both sides of the NMOS active channel pattern to be connected to the NMOS thin body channels and a PMOS source/drain region may be formed next to both sides of the PMOS active channel pattern to be connected to the NMOS thin body channels. An NMOS source/drain extension layer may be interposed between the NMOS thin body channel and the NMOS source/drain region and a PMOS source/drain extension layer may be interposed between the PMOS thin body channel and the PMOS source/drain region.

In other embodiments of the present invention, a CMOS device is manufactured by the following operations: forming a preliminary layer for forming a channel on a semiconductor substrate in which an NMOS region and a PMOS region are defined, the preliminary layer including a sacrificial layer and a thin body channel layer; patterning the preliminary layer for forming the channel to form a preliminary pattern for forming an NMOS channel in the NMOS region and a preliminary pattern for forming a PMOS channel in the PMOS region; anisotropically etching the ends of the preliminary patterns for forming the NMOS and PMOS channels until a surface of the semiconductor substrate is exposed to form a groove, thereby forming a pattern for forming the NMOS channel in the NMOS region and a pattern for forming the PMOS channel in the PMOS region; forming an NMOS source/drain region and a PMOS source/drain region by filling the groove with a material layer; forming an NMOS thin body channel and a PMOS thin body channel by removing a residual sacrificial layer of the patterns for forming the NMOS and PMOS thin body channels; forming an NMOS insulating layer surrounding the NMOS thin body channel on a surface of the NMOS thin body channel when the PMOS region is masked; forming an NMOS metal gate pattern on a surface of and surrounding the NMOS insulating layer; forming a PMOS insulating layer surrounding the PMOS thin body channel on a surface of the PMOS thin body channel when the NMOS region is masked; and forming a PMOS metal gate pattern on a surface of and surrounding the PMOS insulating layer. The NMOS insulating layer includes a silicon oxide layer and the PMOS insulating layer includes an electron-trapping layer, the NMOS insulating layer includes a hole trapping dielectric layer and the PMOS insulating layer includes a silicon oxide layer, or the NMOS insulating layer includes a hole-trapping dielectric layer and the PMOS insulating layer includes an electron-trapping dielectric layer.

Forming an NMOS insulating layer and forming the NMOS metal gate pattern may be preceded by the forming a PMOS insulating layer and the forming a PMOS metal gate pattern.

The patterns for forming NMOS and PMOS channels may be trimmed before the forming NMOS and PMOS source/drain regions.

In still other embodiments of the present invention, an NMOS source/drain extension layer and a PMOS source/drain extension layer may be formed on sidewalls of the patterns for forming NMOS and PMOS channels, respectively, before the forming the NMOS and PMOS source/drain regions. The NMOS and PMOS source/drain extension layers may be formed by epitaxial growth.

A shallow trench isolation layer may be formed in a portion of the semiconductor substrate on which the preliminary patterns for forming NMOS and PMOS channels are not formed after the forming preliminary patterns for forming NMOS and PMOS channels, and exposing a side of the patterns for forming the NMOS and PMOS channels may include etching the shallow trench isolation layer.

In still other embodiments of the present invention, the patterns for forming NMOS and PMOS channels may be trimmed between forming patterns for forming NMOS and PMOS channels and forming an NMOS and PMOS source/drain region.

In still other embodiments of the present invention, an NMOS source/drain extension layer and a PMOS source/drain extension layer may be formed on sidewalls of the patterns for forming NMOS and PMOS channels, respectively.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
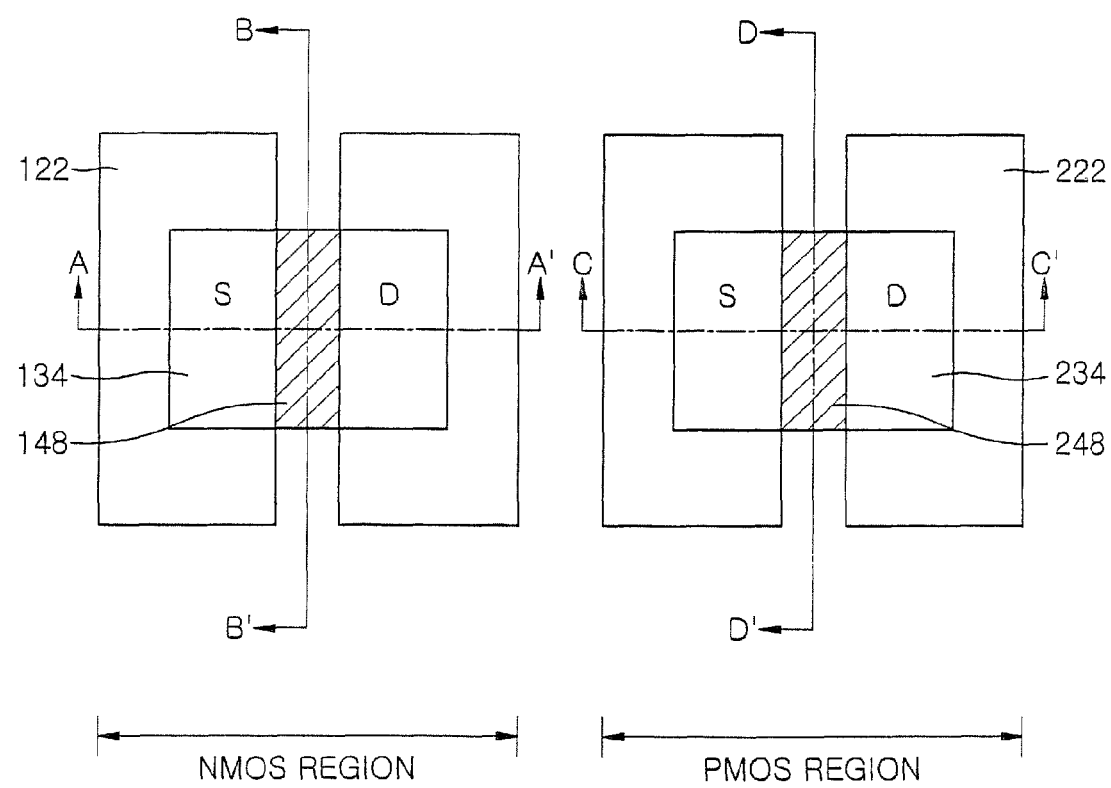
FIG. 1A is a plan view of a complementary metal-oxide semiconductor (CMOS) device including an n-channel metal-oxide semiconductor (NMOS) multi-bridge channel field effect transistor (MBCFET) and a p-channel metal oxide semiconductor (PMOS) MBCFET according to some embodiments of the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout the description of the figures.

It will be understood that when an element is referred to as being "on" another element, it can be directly on the other element or intervening elements may be present. In contrast, when an element is referred to as being "directly on" another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first thin film could be termed a second thin film, and, similarly, a second thin film could be termed a first thin film without departing from the teachings of the disclosure.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in one of the figures were turned over, elements described as being on the "lower" side of other elements would then be oriented on "upper" sides of the other elements. The exemplary term "lower," can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein, but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Some embodiments of the present invention may provide a complementary metal-oxide semiconductor (CMOS) device including a CMOS device with a thin body channel and a symmetric threshold voltage, and a method of manufacturing the same. Some embodiments of the present invention may also provide a CMOS device including a CMOS device including a gate that can comprise a metal material and have a symmetric threshold voltage. Some embodiments of the present invention may also provide a CMOS device including a CMOS device with a low off leakage current and a low, symmetric threshold voltage, which may be useful for a high-performance CMOS device, and a method of manufacturing the same.

Figure 1B:
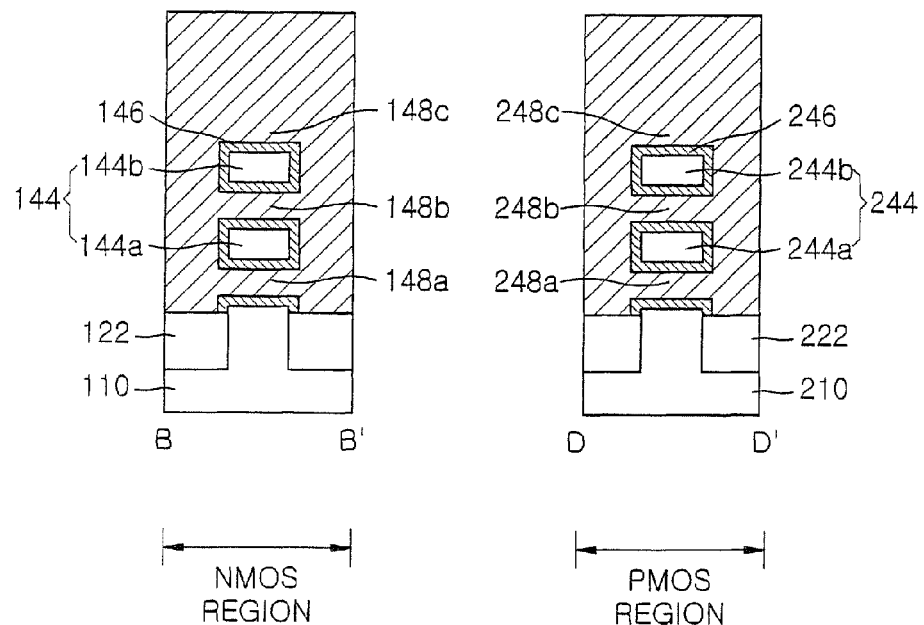
FIG. 1B is a sectional view taken along lines AA' and CC' shown in FIG. 1A.
Figure 1C:
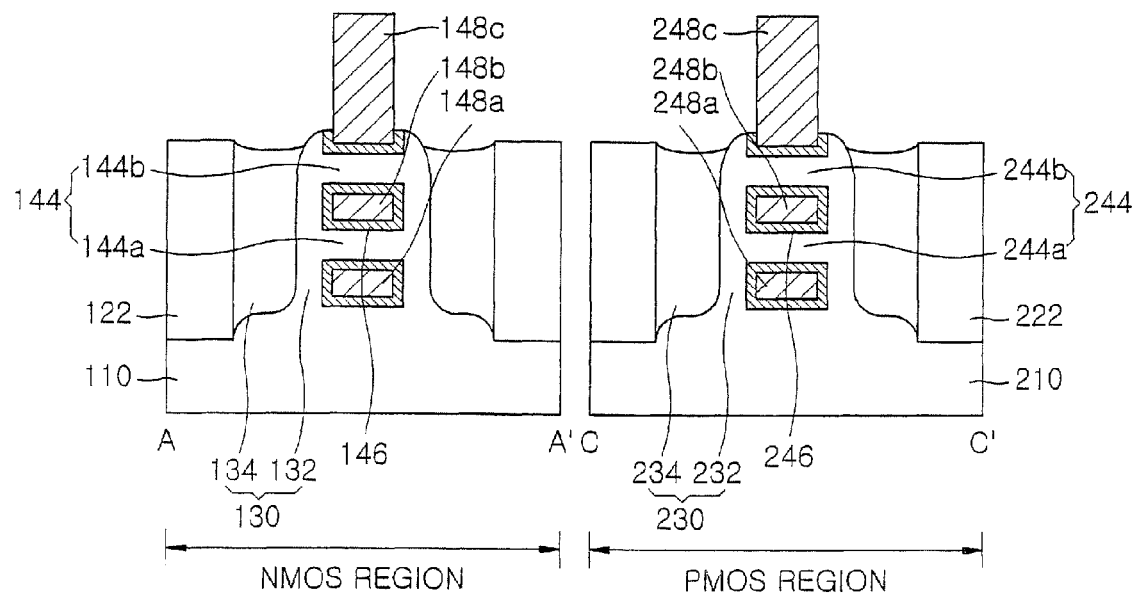
FIG. 1C is a sectional view taken along lines BB' and DD' shown in FIG. 1A.

FIG. 1A is a plan view of a complementary metal-oxide semiconductor (CMOS) device including a multi-bridge channel field effect transistor (MBCFET) according to some embodiments of the present invention. FIG. 1B is a sectional view taken along lines AA' and CC' shown in FIG. 1A. FIG. 1C is a sectional view taken along lines BB' and DD' shown in FIG. 1A.

FIGS. 1A through 1C illustrate a thin body channel CMOS device, and, more particularly, a CMOS device including a MBCFET. In other embodiments of the present invention, a thin-body channel CMOS device may include different types of transistors, such as a CMOS device including a 3-dimensional transistor. Examples of a CMOS device including a 3-dimensional transistor include a CMOS device including a DG FET, a CMOS device including a GAA FET, and the like. Hereinafter, a CMOS device including a MBCFET will be described in detail.

Referring to FIGS. 1A through 1C, an n-channel metal-oxide semiconductor (NMOS) transistor and a p-channel metal-oxide semiconductor (PMOS) transistor included in a CMOS device, in accordance with some embodiments of the present invention, have substantially identical structures. In addition, this structure may be substantially identical to a structure of a conventional thin body channel semiconductor transistor. However, the thin body CMOSFET, according to some embodiments of the present invention, is different from a conventional thin body CMOSFET in that materials comprising NMOS and PMOS insulating layers 146 and 246 and NMOS and PMOS metal gates 148 and 248 of the thin body CMOSFET are different from those of the conventional thin body CMOSFET.

The NMOS transistor and the PMOS transistor in the MBCFETs included in the CMOS device according to some embodiments of the present invention will now be described with reference to FIGS. 1A through 1C (see, e.g., U.S. Publication No. 2004/0063286 A1). Referring to FIGS. 1A through 1C, an NMOS region and a PMOS region are defined in a substrate 110 and 210. An NMOS thin body channel 144 is formed on the substrate 110 of the NMOS region. The NMOS thin body channel 144 comprises a plurality of channels 144a and 144b stacked vertically. An NMOS source/drain region 134 is formed on opposite sides of the NMOS thin body channel 144 and is connected to the channels 144a and 144b. Likewise, a PMOS thin body channel 244 is formed on the substrate 210 of the PMOS region. The PMOS thin body channel 244 comprises a plurality of channels 244a and 244b stacked vertically. A PMOS source/drain region 234 is formed on opposite sides of the PMOS thin body channel 244 and connected to the channels 244a and 244b. NMOS and PMOS source/drain extension layers 132 and 232 may be formed between the NMOS and PMOS thin body channels 144 and 244 and the NMOS and PMOS source/drain regions 134 and 234, respectively. The NMOS and PMOS source/drain extension layers 132 and 232 may comprise single crystalline silicon doped with an impurity.

A plurality of tunnels is formed between the channels 144a and 144b, and between the channels 244a and 244b. In addition, a groove having a tunnel shape is formed on an uppermost channel. The channels 144a, 144b, 244a, and 244b may comprise a semiconductor material, such as a single-crystalline silicon. The single-crystalline silicon may be undoped mono-crystalline silicon or nitrogen-doped single-crystalline silicon.

NMOS and PMOS insulating layers 146 and 246 are formed on surfaces of the NMOS and PMOS thin body channels 144 and 244, respectively. The NMOS and PMOS insulating layers 146 and 246 surround the NMOS and PMOS thin body channels 144 and 244, respectively. The NMOS insulating layer 146 may be comprise silicon oxide or a hole-trapping dielectric. As used herein, "hole-trapping dielectric" refers to a high-k material having many holes compared to silicon oxide. The hole-trapping dielectric may be, for example, $HfO_2$. The PMOS insulating layer 246 may comprise silicon oxide or an electron-trapping dielectric. In some embodiments of the present invention, when the NMOS insulating layer 146 comprises silicon oxide, the PMOS insulating layer 246 may comprise a different material. As used herein, "electron-trapping dielectric" refers to a high-k material having many electrons compared to silicon oxide. The electron-trapping dielectric may be, for example, $Al_2O_3$.

A threshold voltage of an NMOS transistor is lower when the NMOS insulating layer 146 comprises a hole-trapping dielectric than when the NMOS insulating layer 146 comprises silicon oxide, or a dielectric having similar electrical characteristics to silicon oxide. Likewise, a threshold voltage of a PMOS transistor is lower when the PMOS insulating layer 246 comprises an electron-trapping dielectric than when the PMOS insulating layer 246 comprises silicon oxide, or a dielectric material having similar electrical characteristics to silicon oxide.

When the NMOS insulating layer 146 comprises a hole-trapping dielectric, an interface layer (not shown) may further be formed between the NMOS thin body channel 144 and the hole-trapping dielectric layer 146 to prevent the formation of a rough interface therebetween. Likewise, when the PMOS insulating layer 246 comprises an electron-trapping dielectric, an interface layer (not shown) may further be formed between the PMOS thin body channel 244 and the electron trap dielectric layer 246 to prevent the formation of a rough interface therebetween. The interface layer may comprise silicon oxide, silicon oxynitride, silicate, or a combination of these materials. Each of the silicon oxide and the silicon oxynitride materials may have a dielectric constant less than or equal to about 9.

The NMOS and PMOS insulating layers 146 and 246 are surrounded by NMOS and PMOS gate electrodes 148 and 248, respectively. The tunnels may be completely surrounded by the NMOS and PMOS gate electrodes 148 and 248. The NMOS and PMOS gate electrodes 148 and 248 may comprise a metal material suitable for a high-performance CMOS device. For example, the NMOS and PMOS gate electrodes 148 and 248 may comprise TaN, Hf, TiN, W, Mo, or the like. In this case, the NMOS gate electrode 148 and the PMOS gate electrode 248 may comprise identical materials or different materials.

As described above, the CMOS device with a thin body channel according to some embodiments of the present invention comprises NMOS and PMOS gate materials 148 and 248 comprising a metal. In addition, the NMOS insulating layer 146 may comprise a silicon oxide and/or a hole-trapping dielectric, and the PMOS insulating layer 246 may comprise a silicon oxide and/or an electron-trapping dielectric. A material comprising the NMOS insulating layer 146 and the PMOS insulating layer 246 may vary according to a material comprising the NMOS and PMOS metal gates 148 and 248. In addition, the material comprising the NMOS and PMOS insulating layers 146 and 246 is determined in consideration that a thin body channel CMOS device may have a symmetric and low threshold voltage (e.g. ±0.2V), which is desired for a high-performance CMOS device. For example, when a channel comprises undoped silicon, the NMOS and PMOS metal gates 148 and 248 comprise TiN, and the NMOS and PMOS insulating layers 146 and 246 comprise silicon oxide.

Figure 2:
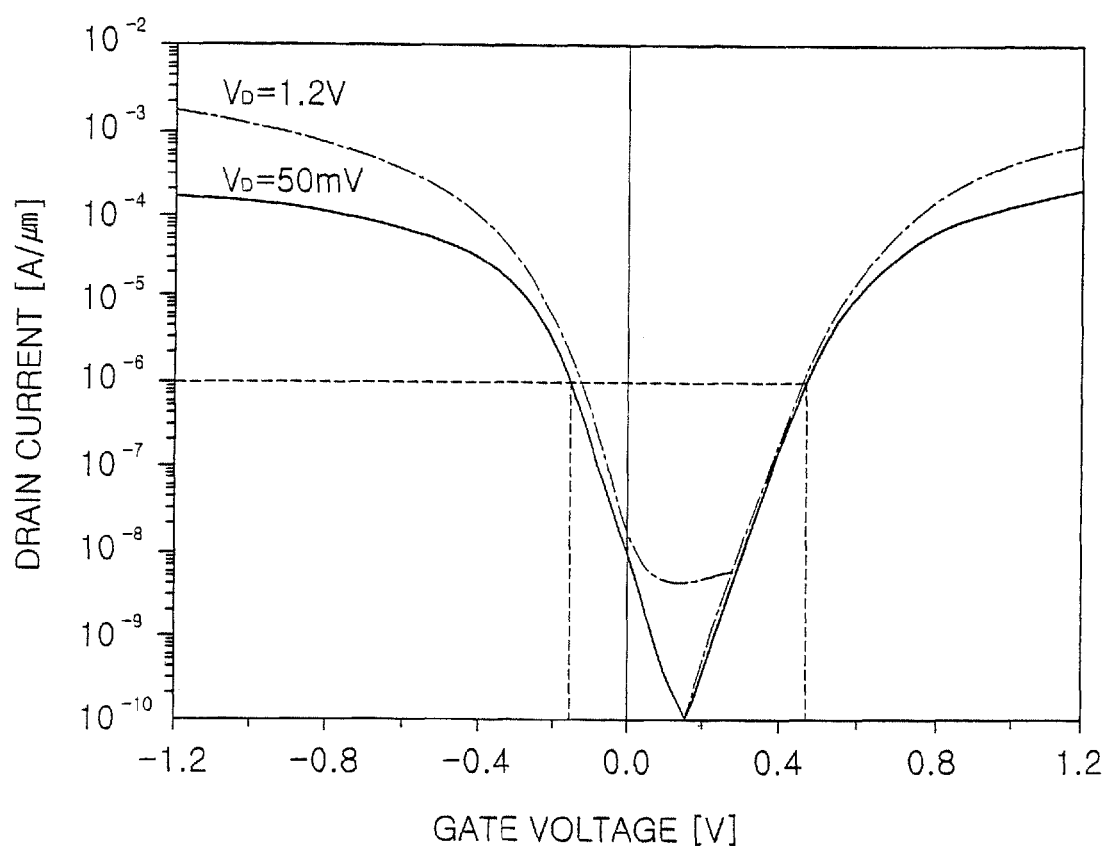
FIG. 2 is a graph illustrating a drain current per unit with respect to a gate voltage of an NMOS MBCFET and a PMOS MBCFET, each including a silicon oxide dielectric layer and a TIN gate in accordance with some embodiments of the present invention.

NMOS and PMOS threshold voltages are shown in FIG. 2. FIG. 2 is a graph of a drain current per unit distance with respect to a gate voltage of a MBCFET with a channel length of about 30 nm and a channel width of about 95 nm. In this case, drain voltages ($V_D$) of 1.2 V and 50 mV are applied. Referring to FIG. 2, when a drain current per unit distance is about $10^{-6}$ A/µm, the threshold voltages of the PMOS transistor and the NMOS transistor are about −0.2 V and about 0.5 V, respectively. Therefore, the PMOS transistor has a desired threshold voltage (−0.2V), but the NMOS transistor is higher than a desired threshold voltage (+0.2V).

A high performance thin body channel CMOS device with a symmetric threshold voltage can be manufactured using various methods. In a manufacturing method according to some embodiments of the present invention, an NMOS insulating layer 146 comprises a hole-trapping dielectric. As discussed above, if the NMOS insulating layer 146 comprises a hole-trapping dielectric, the threshold voltage of an NMOS transistor decreases. Therefore, the NMOS transistor has a desired threshold voltage, or a threshold voltage that is not much greater than the desired threshold voltage.

In a manufacturing method according to other embodiments of the present invention, NMOS and PMOS thin body channels 144 and 244 comprise N-doped silicon. In this case, the threshold voltage of an NMOS transistor decreases and the threshold voltage of a PMOS transistor increases. As a result, the NMOS transistor has a threshold voltage that is not much greater than the desired threshold voltage, but the PMOS transistor has a threshold voltage greater than the desired threshold voltage. That is, the threshold voltage of the NMOS transistor is less than about 0.5 V, and the threshold voltage (the absolute value) of the PMOS transistor is greater than about −0.2 V. In addition, an NMOS insulating layer 146 comprises a hole-trapping dielectric to reduce the threshold voltage of the NMOS transistor to the desired threshold voltage, and a PMOS insulating layer 246 comprises an electron-trapping dielectric to reduce the threshold voltage of the PMOS transistor to the desired threshold voltage. Therefore, the NMOS transistor has a threshold voltage of about +2V and the PMOS transistor has a threshold voltage of about −2V. That is, a thin body channel CMOS device with a symmetric threshold voltage can be manufactured.

The method of manufacturing a thin body channel CMOS device with a symmetric threshold voltage can also be used to form a CMOS device having a metal gate by using a TiN gate. In more detail, when a gate-insulating layer comprises silicon oxide, the threshold voltage of an NMOS transistor including such a gate-insulating layer is about equal to a desired threshold voltage. However, the threshold voltage of a PMOS transistor including such a gate-insulating layer is greater than a desired threshold voltage. In this case, when the gate-insulating layer of the PMOS transistor comprises an electron-trapping dielectric, the desired thin body channel CMOS device with a symmetric threshold voltage can be manufactured.

FIGS. 3A through 3K are perspective views illustrating methods of manufacturing CMOS device having a thin body channel according to some embodiments of the present invention. Methods of manufacturing a MBCFET-including CMOS device, which is used in the previous embodiments, will now be described. In other embodiments, a thin-body channel CMOS device may include a different type of transistor, such as a CMOS device including a 3-dimensional transistor. Examples of a CMOS device including a 3-dimensional transistor include a CMOS device including a DG FET, a CMOS device including a GAA FET, and the like. Hereinafter, methods of manufacturing the CMOS device including a MBCFET will be described in detail (see, e.g., U.S. Publication No. 2004/0063286 AI).

Figure 3A:
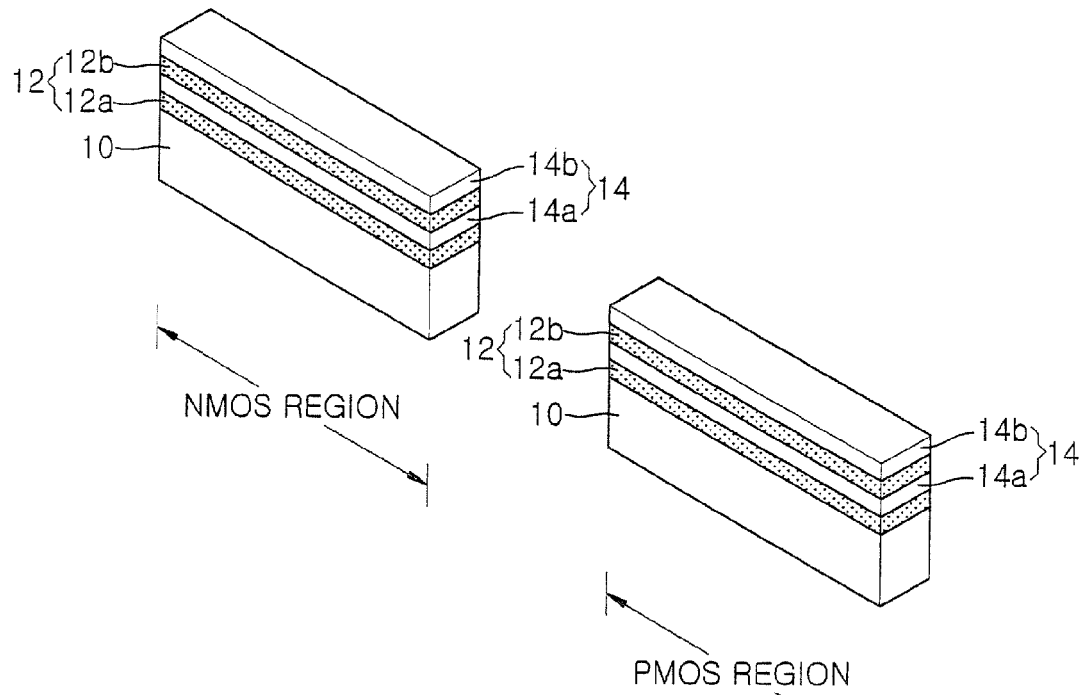
FIGS. 3A through 3K are perspective views illustrating methods of manufacturing the CMOS device shown in FIG. 1 in accordance with some embodiments of the present invention.

Referring to FIG. 3A, preliminary patterns 12 and 14 comprising NMOS and PMOS channels are formed by stacking an SiGe/Si layer on a semiconductor substrate 10. That is, a SiGe layer and a Si layer are alternately stacked on the semiconductor substrate 10, in which an NMOS region and a PMOS region are defined, to form preliminary patterns 12 and 14 comprising the NMOS and PMOS channels. In this case, the SiGe layer is a sacrificial layer, and the Si layer is a thin body channel layer. In more detail, a first sacrificial layer is formed on the semiconductor substrate 10, and then a first thin body channel layer is formed thereon. Although a second thin body channel layer may be an uppermost layer according to some embodiments of the present invention, a third sacrificial layer (not shown) may be further formed on the second thin body channel layer. The thin body channel layer may be formed by selective epitaxial growth (SEG) of undoped silicon and N-doped silicon.

In addition, a conventional shallow trench isolation (STI) forming process for electrically isolating the regions, which is not shown in FIG. 3A, is used. The preliminary patterns 12 and 14 comprising the NMOS and PMOS channels are patterned when the semiconductor substrate 10 is patterned to form a STI by using a first mask pattern defining an active region as a mask. Thus, the preliminary patterns 12 and 14 comprising the NMOS and PMOS channels are formed on the semiconductor substrate 10, and an STI trench (not shown) is formed in the semiconductor substrate 10. After the first mask pattern is removed, the trench is filled by an insulating layer with generally excellent gap-fill characteristics, such as an HDP oxide layer. At the same time, the HDP oxide layer is formed adjacent to the preliminary patterns 12 and 14 comprising NMOS and PMOS channels. As a result, an STI region is formed up to an upper surface of the preliminary patterns 12 and 14 comprising the NMOS and PMOS channels. However, the STI region is not shown in FIGS. 3A through 3D so that the preliminary patterns 12 and 14 comprising the NMOS and PMOS channels are exposed.

Figure 3B:
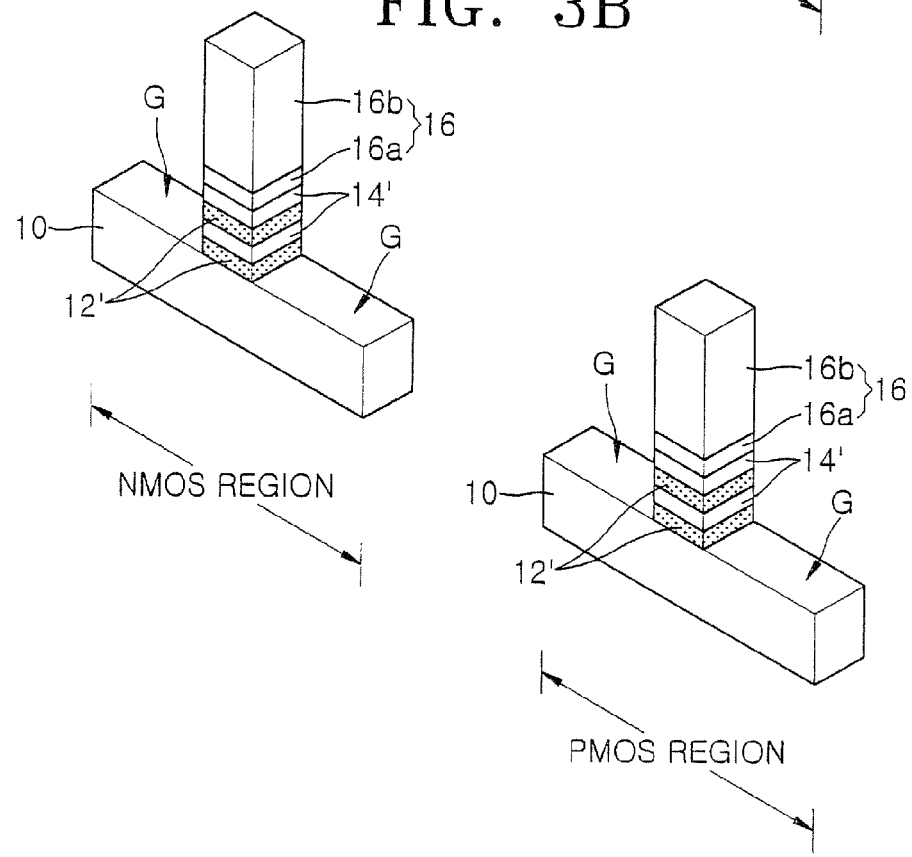

Referring to FIG. 3B, patterns 12' and 14' comprising the NMOS and PMOS channels are formed. In detail, a second mask pattern 16 is formed on the preliminary patterns 12 and 14 comprising NMOS and PMOS channels. The second mask pattern 16 exposes both ends of the preliminary patterns 12 and 14 for forming the NMOS and PMOS channels, and defines a channel region. The second mask pattern 16 may include a silicon oxide layer 16b. In addition, the second mask pattern 16 may further include a silicon nitride layer 16a beneath the silicon oxide layer 16b. In this case, the silicon nitride layer 16a functions as a buffer layer.

Then, the preliminary patterns 12 and 14 for forming the NMOS and PMOS channels are anisotropically etched using the second mask pattern 16 as an etch mask. The anisotropic etching is performed until an upper surface of the semiconductor substrate 10 is exposed. As a result, patterns 12' and 14' for forming the NMOS and PMOS channels are formed, and a groove G surrounded by the STI and the patterns 12' and 14' for forming the NMOS and PMOS channels is formed on the exposed semiconductor substrate 10.

Figure 3C:
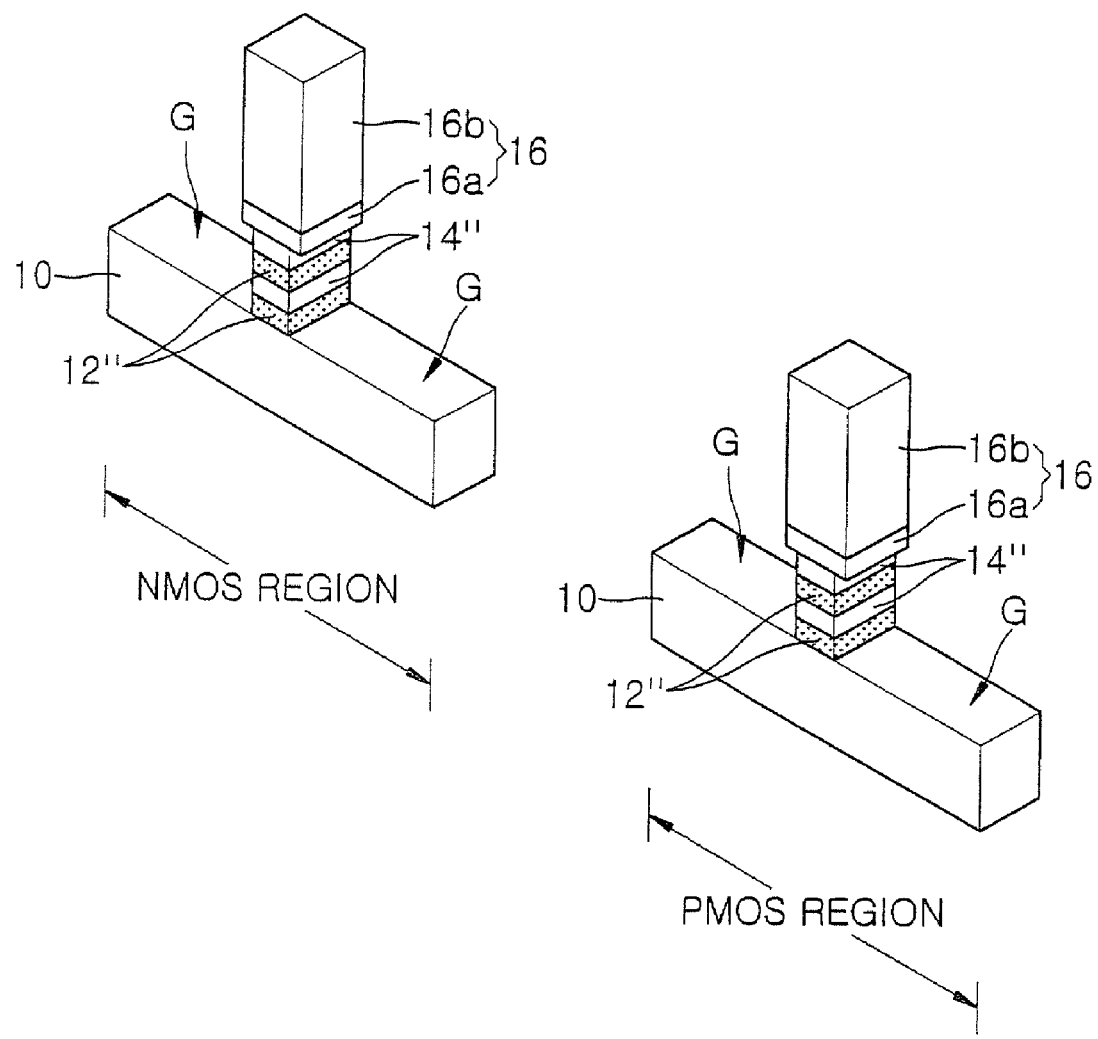

Referring to FIG. 3C, the patterns 12' and 14' are trimmed to form the NMOS and PMOS channels. That is, the patterns 12' and 14' for forming the NMOS and PMOS channels are etched on the edge of the groove G. At this time, an isotropic etching process is used, such as wet etching or chemical dry etching. This process is performed to reduce the lengths of thin body channels of the NMOS and PMOS transistors. Therefore, when a width of the second mask pattern 16 is equal to a desired channel length, this process can be omitted. As a result of the trimming, patterns 12" and 14" for forming the NMOS and PMOS channels with a reduced length are formed.

Figure 3D:
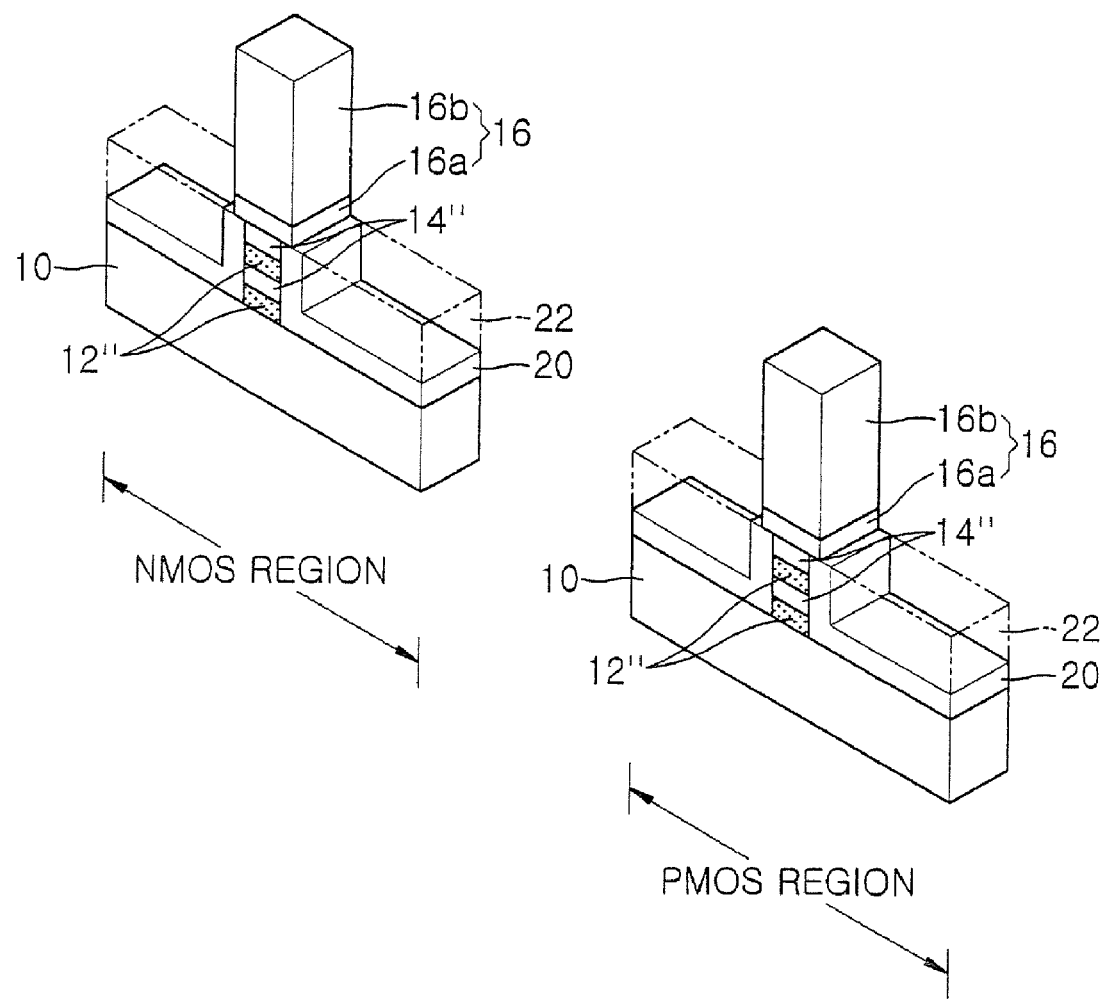

Referring to FIG. 3D, an NMOS and PMOS source/drain extension layer 20 and an NMOS and PMOS source/drain region 22 are formed. That is, an NMOS and PMOS source/drain extension layer 20 is formed on the surface of the semiconductor substrate 10 exposed by the groove G and sidewalls of the patterns 12" and 14" for forming the NMOS and PMOS channels. The NMOS and PMOS source/drain extension layer 20 may be formed using impurity-doped silicon. Alternatively, the NMOS and PMOS source/drain extension layer 20 can be formed in the following operations: First, an undoped silicon layer is formed. Then, ion implantation is performed to control the concentration of a doping impurity. After the NMOS and PMOS source/drain extension layer 20 is formed, a conductive material layer filling the groove G is deposited on the NMOS and PMOS source/drain extension layer 20 to form the NMOS and PMOS source/drain region 22.

Figure 3E:
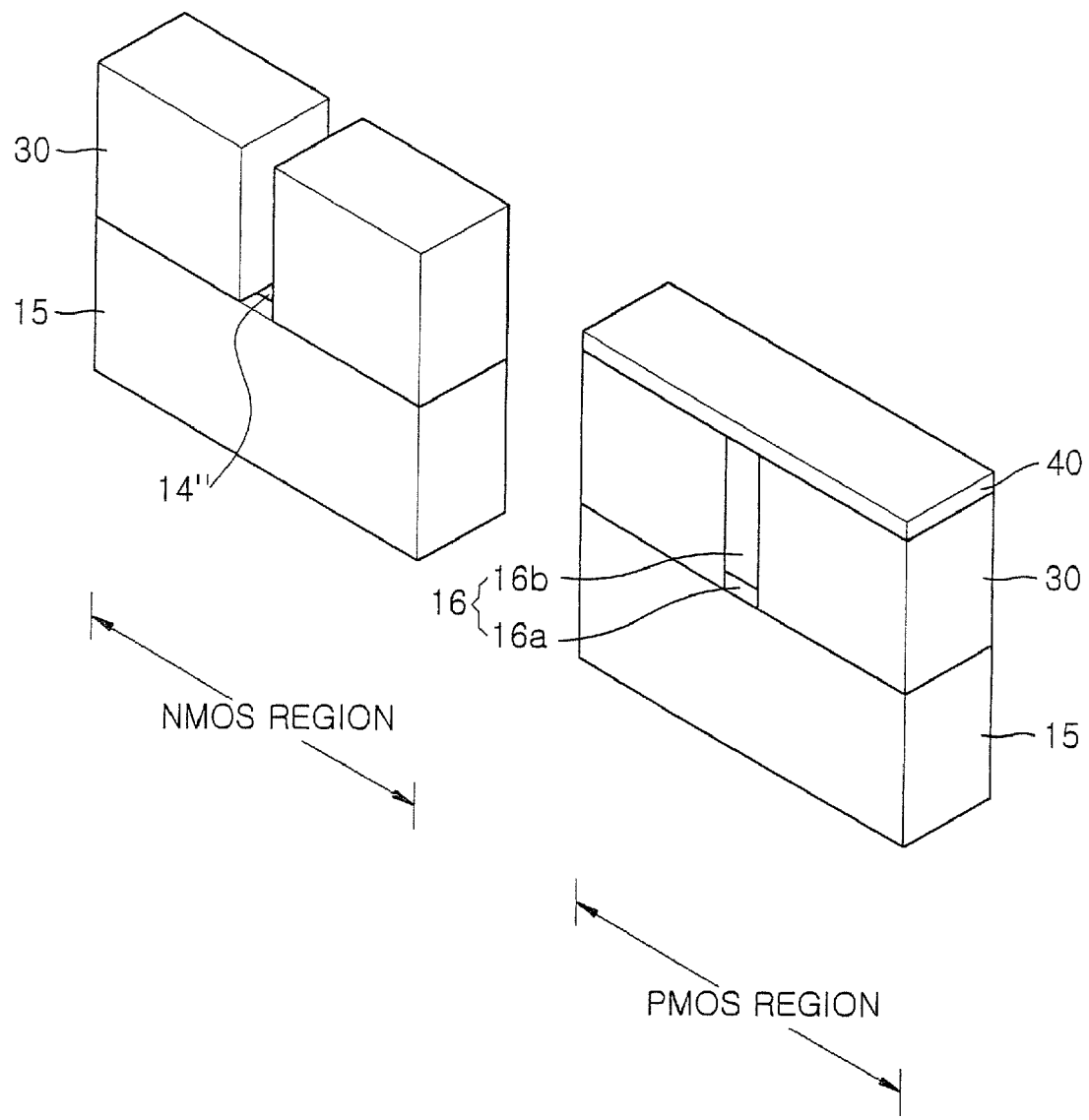

FIG. 3E is a perspective view illustrating operations in forming a third mask pattern 30 covering the NMOS and PMOS source/drain region 22, and a fourth mask pattern covering the entire PMOS region. Hereinafter, the STI 15 is shown in drawings.

Figure 3F:
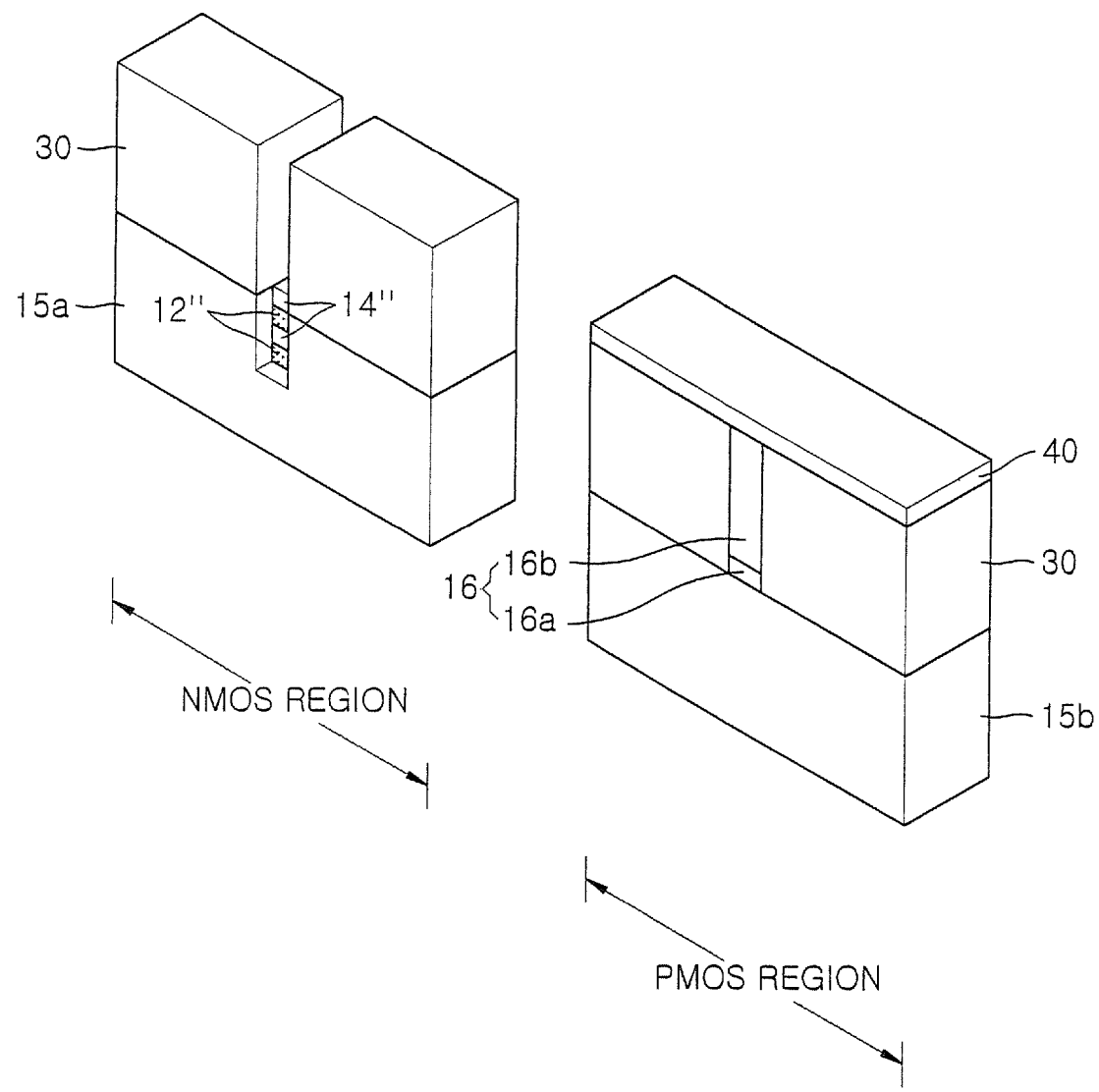
Figure 3G:
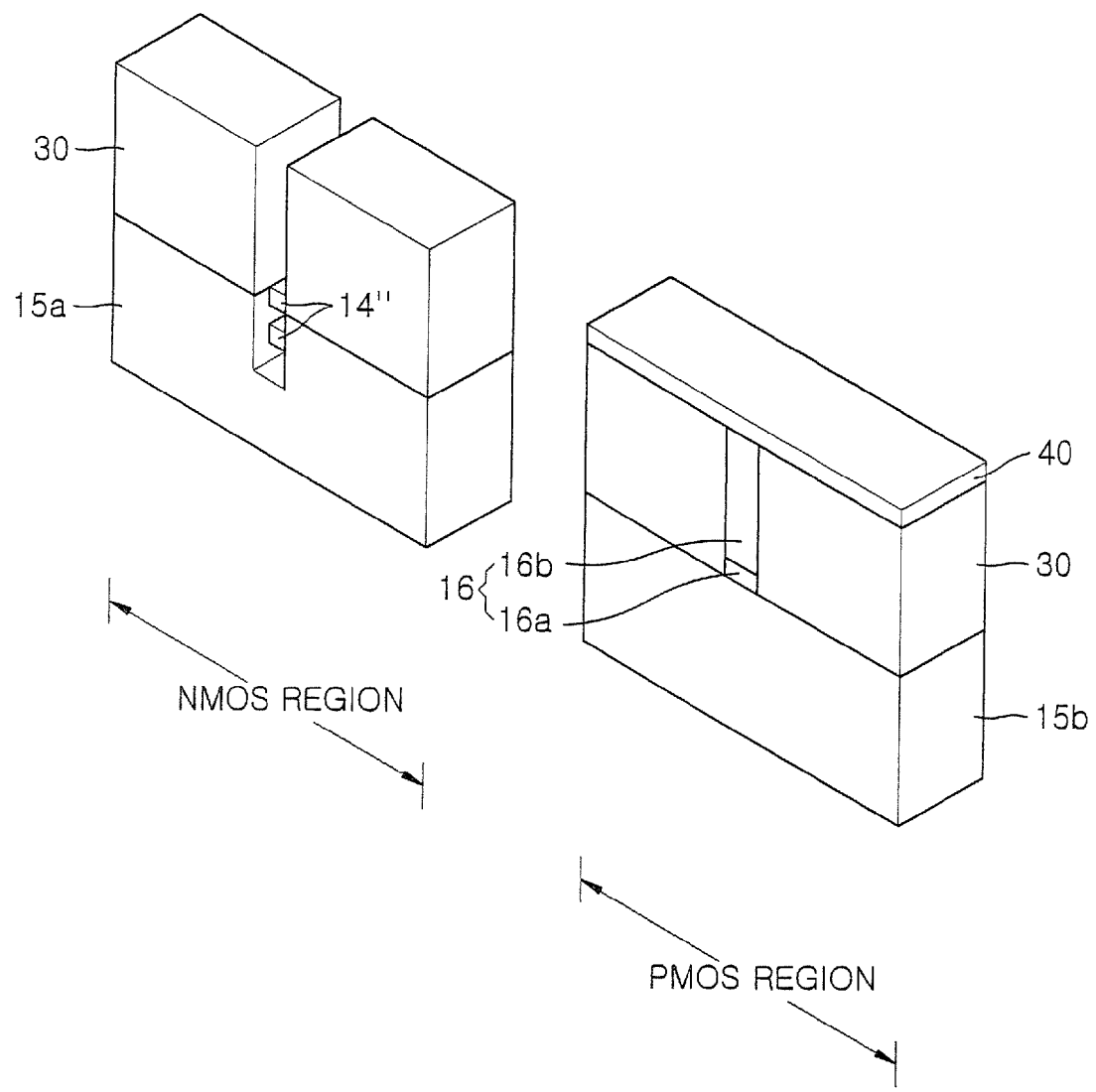

Referring to FIG. 3E, a material layer for forming a third mask pattern 30 is deposited to a large thickness on the entire surface of the resulting structure in which the NMOS and PMOS source/drain region 22 is formed. The material layer may comprise silicon nitride having high etch selectivity with respect to the second mask pattern 16. The material layer is planarized until an upper surface of the second mask pattern 16 is exposed to form the third mask pattern 30. The third mask pattern 30 covers the STI region 15 formed on front and rear sidewalls of the NMOS and PMOS source/drain region 22. Subsequent processes illustrated in FIGS. 3F and 3G are performed only on the NMOS region using a fourth mask pattern 40. During these operations, the fourth mask pattern 40 exposes the NMOS region, but covers the PMOS region.

Referring to FIG. 3E, the fourth mask pattern 40 is formed on the entire PMOS region using a conventional process for forming a semiconducting material layer. The fourth mask pattern 40 may be a photoresist layer. Alternatively, the fourth mask pattern 40 may comprise a material having high etch selectivity with respect to the second mask pattern 16 and the third mask pattern 30. After the formation of the fourth mask pattern 40, the second mask pattern 16 formed in the NMOS region is removed.

Referring to FIG. 3F, a sidewall of the patterns 12" and 14" for forming the NMOS channel is exposed by etching the STI region 15 of the NMOS region. Referring to FIG. 3F, the exposed STI region 15 is anisotropically etched using the third mask pattern 30 as an etch mask. The STI region 15 is etched until the first sacrificial pattern 12a of the patterns 12" and 14" for forming the NMOS channel is exposed.

Referring to FIG. 3G, the sacrificial pattern 12" of the NMOS region is removed. Referring to FIG. 3G, the sacrificial pattern 12' is selectively removed by isotropic etching, for example, wet etching or chemical dry etching. As a result, an NMOS thin body channel 14" is formed with a two-stair structure, and tunnels are formed between upper and lower parts of the NMOS thin body channel 14", and between the lower part of the NMOS thin body channel 14".

Figure 3H:
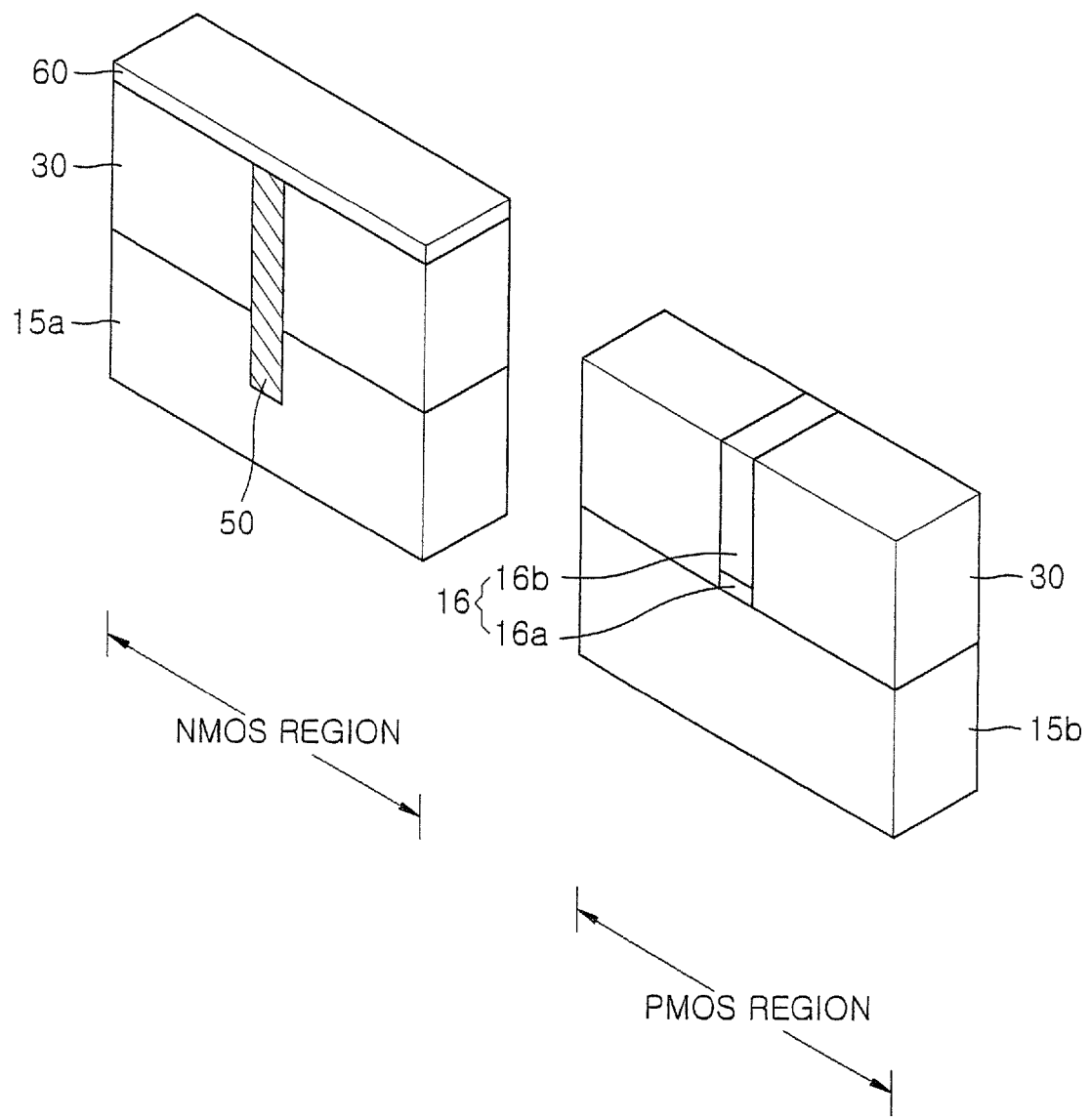

Referring to FIG. 3H, an NMOS insulating layer and an NMOS metal gate pattern 50 are formed, the fourth mask pattern 40 covering the PMOS region is removed, and then a fifth mask pattern 60 covering the entire NMOS region is formed.

That is, the NMOS insulating layer (not shown) surrounding the exposed NMOS thin body channel 14" is formed. The NMOS insulating layer may comprise a silicon oxide or a hole-trapping dielectric, according to a material comprising a metal gate pattern 50 to be formed in a subsequent process, and a threshold voltage of the metal gate pattern 50. The hole-trapping dielectric may be $HfO_2$. When the NMOS insulating layer comprises the hole-trapping dielectric, an NMOS interface layer may be further formed before the formation of the hole-trapping dielectric layer. A method of forming the NMOS interface layer and the $HfO_2$ layer is described in detail in U.S. patent application Ser. No. 10/930,943 filed on Sep. 1, 2004, which is assigned to the assignee of the present application. U.S. patent application Ser. No. 10/930,943 is hereby incorporated herein by reference.

For example, the $HfO_2$ layer can be formed using chemical vapor deposition (CVD) or atomic layer deposition (ALD). When the $HfO_2$ layer is formed using CVD, a source material for Hf and a source material for O are provided at a temperature of about 400 to 500° C. and a pressure of about 1 to 5 torr. In this case, the source material for Hf may be $HfCl_4$, $Hf(OtBu)_4$, $Hf(NEtMe)_4$, $Hf(MMP)_4$, $Hf(NEt_2)_4$, $Hf(NMe_2)_4$, or the like; and the source material for O may be $O_2$, $O_3$, an oxygen radical, or the like. When the $HfO_2$ layer is formed using ALD, a source material for Hf and a source material for O are provided at a temperature of about 150 to 500° C. and a pressure of about 0.1 to 5 torr. In this case, the source material for Hf may be a metal organic precursor, such as $HfCl_4$, $Hf(OtBu)_4$, $Hf(NEtMe)_4$, $Hf(MMP)_4$, $Hf(NEt_2)_4$, $Hf(NMe_2)_4$, and the like; and the source material for O may be $H_2O$, $H_2O_2$, an alcohol containing —OH, $O_3$, $O_2$ or the like. The deposition process and a purging process are repeated until the $HfO_2$ layer has a desired thickness. When the $HfO_2$ layer is formed using ALD, many advantages may be obtained: First, the deposition process can be performed at low temperatures. Second, good step coverage can be obtained. Third, the thickness of the $HfO_2$ layer can be easily adjusted.

In addition, optionally, the $HfO_2$ layer is annealed to be densified under an atmosphere containing an element selected from $N_2$, NO, $N_2O$, $NH_3$, and $O_2$, or a combination of these. When annealing, the atmosphere may include a nitrogen atom. The $HfO_2$ layer is nitrided by annealing under an atmosphere including the nitrogen atom. However, other atmospheric conditions can be used to nitride the $HfO_2$ layer. For example, a vacuum condition can be used when the $HfO_2$ layer is annealed to be hardened.

The annealing of the $HfO_2$ layer may be performed at about 750 to 1050° C. An etch rate of the $HfO_2$ layer decreases substantially after annealing when using a wet cleaning solution for the $HfO_2$ layer, particularly, a cleaning solution containing F. When the temperature for the annealing is less than about 750° C., the etch rate of the $HfO_2$ layer is not decreased to a desired level. On the other hand, when the temperature for the annealing is higher than about 1050° C., the $HfO_2$ layer is crystallized, thus increasing a leakage current.

Referring to FIG. 3H, a metal, such as TiN, or the like, is deposited on the NMOS insulating layer using a conventional method of depositing a material layer to form the NMOS metal gate 50. According to the present embodiment, the NMOS metal gate 50 is formed using a damascene process, not using a conventional deposition and etch process. Therefore, deterioration of an etch profile occurring when a refractory metal is etched can be prevented. After the formation of the NMOS metal gate 50, the fourth mask pattern 40 covering the CMOS region is removed. Then, a fifth mask pattern 60 covering the entire NMOS region is formed using the material of which the fourth mask pattern 40 is comprised.

Figure 3I:
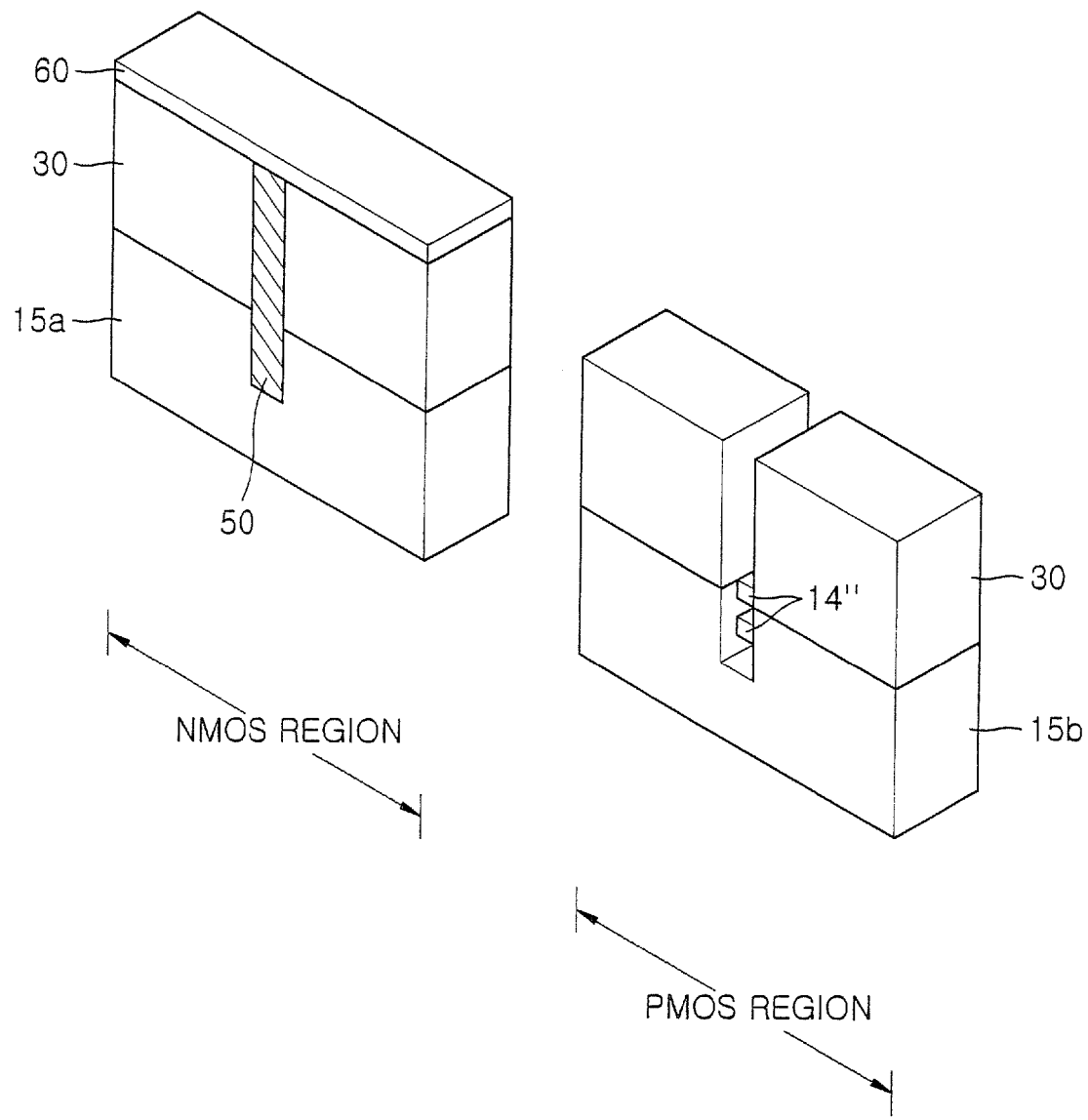

Referring to FIG. 3I, the second mask pattern 16 of the NMOS region is removed to expose the patterns 12" and 14" for forming the PMOS channel. This operation is the same as the corresponding operation performed in the NMOS region. Therefore, the detailed description for this operation will be omitted for the sake of brevity.

Figure 3J:
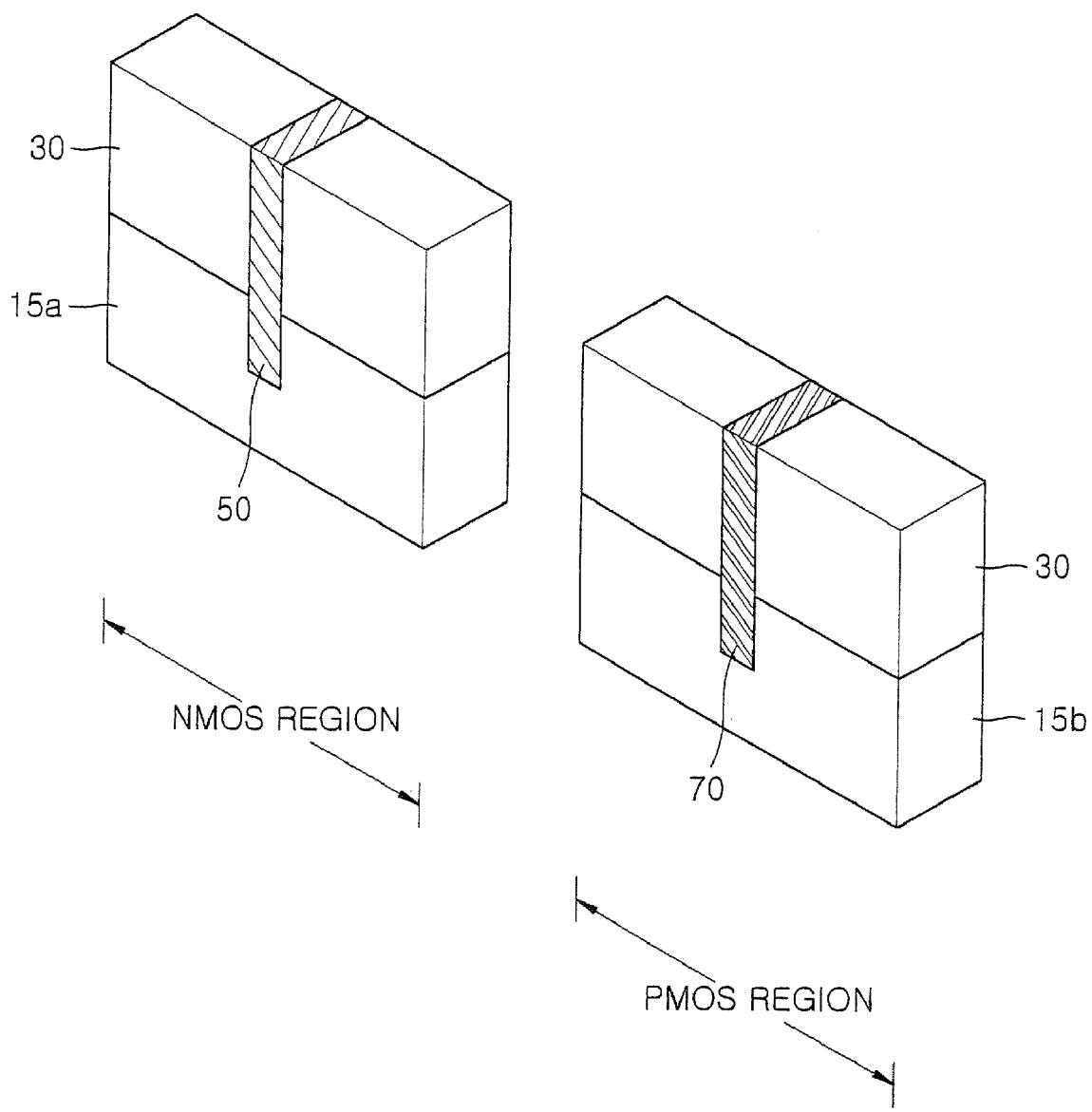

Referring to FIG. 3J, a PMOS insulating layer and a PMOS metal gate pattern 70 are formed, and then the fifth mask pattern 60 covering the NMOS region is removed. That is, a PMOS insulating layer (not shown) surrounding the exposed PMOS thin body channel 14" is formed. The PMOS insulating layer may comprise silicon oxide or an electron-trapping dielectric according to a material comprising the PMOS metal gate pattern 70, which will be formed in a subsequent process, and affects the threshold voltage of the PMOSFET. In this case, the electron-trapping dielectric may be $Al_2O_3$. When the PMOS insulating layer comprises the electron-trapping dielectric, a PMOS interface layer may be further formed before the PMOS interface layer is formed. Methods of manufacturing the PMOS interface layer and an $Al_2O_3$ layer are described in detail in U.S. patent application Ser. No. 10/930,943, entitled "Semiconductor Devices Having Different Gate Dielectrics and Methods for Manufacturing the Same," which is hereby incorporated herein by reference.

The $Al_2O_3$ layer may be formed using CVD or ALD. When the $Al_2O_3$ layer is formed using ALD, trimethyl aluminum (TMA) used as a first reacting material is reacted with $O_3$ used as a second reacting material, at a temperature of about 200 to 500° C. and at a pressure of about 0.1 to 5 torr. This process and a purging process are repeated until the $Al_2O_3$ layer has a desired thickness. The first reacting material may also be $AlCl_3$, $AlH_3N(CH_3)_3$, $C_6H_{15}AlO$, $(C_4H_9)_2AlH$, $(CH_3)_2AlCl$, $(C_2H_5)_3Al$, $(C_4H_9)_3Al$, or the like. The second reacting material may also be an activated oxidizing agent, such as $H_2O$, $H_2O_2$, plasma $N_2O$, plasma $O_2$, or the like. In particular, when the second reacting material is $O_3$, the subsequent annealing can be omitted or performed using a minimum thermal budget.

Referring to FIG. 3J, a metal material, such as TiN, or the like, is deposited on the PMOS insulating layer to form a PMOS metal gate 70 using a conventional method of depositing a material layer. The PMOS metal gate 70 and the NMOS metal gate 50 may comprise identical metals or different metals. According to some embodiments of the present invention, the PMOS metal gate 70 is formed using a damascene process, not using a conventional deposition and etch process. Therefore, deterioration of an etch profile occurring when a refractory metal is etched can be prevented. After the formation of the PMOS metal gate 70, the fifth mask pattern 60 covering the NMOS region is removed.

Figure 3K:
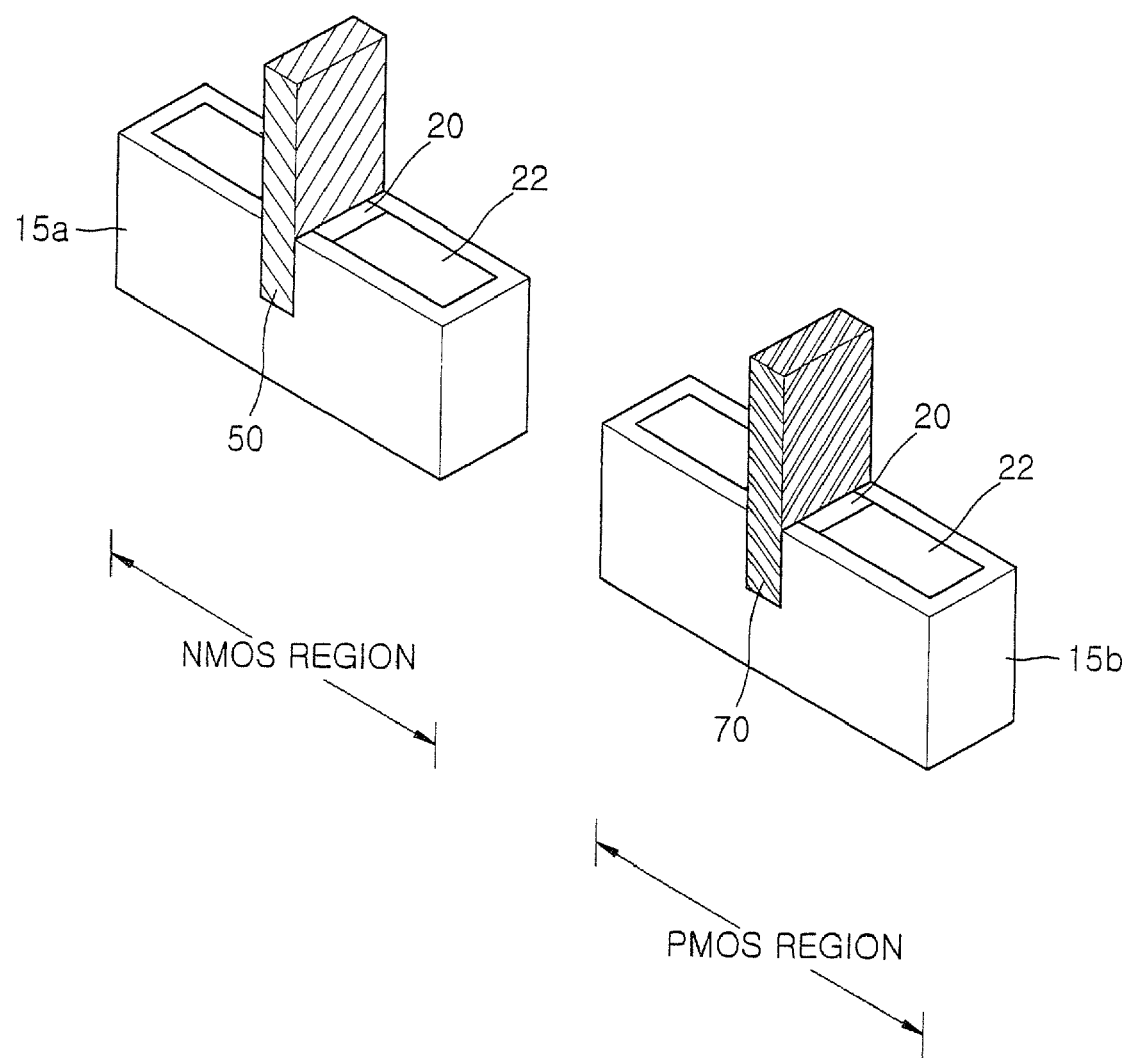

Referring to FIG. 3K, the third mask pattern 30 is removed. When the third mask pattern 30 comprises silicon nitride, the third mask pattern 30 can be easily removed using a wet etching process, such as phosphoric acid stripping.

Then, formation of the CMOS device is completed using a conventional method of manufacturing a semiconductor device.

According to some embodiments of the present invention, an NMOS insulating layer and a PMOS insulating layer comprise a hole-trapping dielectric and an electron-trapping dielectric, respectively, according to a material comprising the NMOS and PMOS metal gates. Therefore, a thin body CMOS device with a low and symmetric threshold voltage can be easily manufactured.

Further, a metal gate can be formed using any metal material. In particular, the metal gate may be formed using a damascene process, thus reducing deterioration of a profile of the metal gate due to etching.

In concluding the detailed description, it should be noted that many variations and modifications can be made to the embodiments without substantially departing from the principles of the present invention. All such variations and modifications are intended to be included herein within the scope of the present invention, as set forth in the following claims.

That which is claimed:

1. A method of manufacturing a complementary metal-oxide semiconductor (CMOS) device, comprising:
    forming a preliminary layer for forming a channel on a semiconductor substrate in which an NMOS region and a PMOS region are defined, the preliminary layer including a sacrificial layer and a thin body channel layer;
    patterning the preliminary layer for forming the channel to form a preliminary pattern for forming an NMOS channel in the NMOS region and a preliminary pattern for forming a PMOS channel in the PMOS region;
    anisotropically etching the ends of the preliminary patterns for forming the NMOS and PMOS channels until a surface of the semiconductor substrate is exposed to form a groove, thereby forming a pattern for forming the NMOS channel in the NMOS region and a pattern for forming the PMOS channel in the PMOS region;
    trimming the patterns for forming the NMOS and PMOS channels;
    forming an NMOS source/drain region and a PMOS source/drain region by filling the groove with a material layer after trimming the patterns for forming the NMOS and PMOS channels;
    forming an NMOS thin body channel and a PMOS thin body channel by removing a residual sacrificial layer of the patterns for forming the NMOS and PMOS thin body channels;
    forming an NMOS insulating layer surrounding the NMOS thin body channel on a surface of the NMOS thin body channel when the PMOS region is masked;
    forming an NMOS metal gate pattern on a surface of and surrounding the NMOS insulating layer;
    forming a PMOS insulating layer surrounding the PMOS thin body channel on a surface of the PMOS thin body channel when the NMOS region is masked; and
    forming a PMOS metal gate pattern on a surface of and surrounding the PMOS insulating layer;
    wherein the NMOS insulating layer comprises a silicon oxide layer and the PMOS insulating layer comprises an electron-trapping layer, the NMOS insulating layer comprises a hole trapping dielectric layer and the PMOS insulating layer comprises a silicon oxide layer, or the NMOS insulating layer comprises a hole-trapping dielectric layer and the PMOS insulating layer comprises an electron-trapping dielectric layer; and
    wherein, in trimming the patterns for forming the NMOS and PMOS channels, the sacrificial layer and the thin body channel layer of the patterns for forming the NMOS and PMOS channels are simultaneously etched.

2. The method of claim 1, wherein the forming the NMOS insulating layer and the forming the NMOS metal gate pattern are preceded by the forming a PMOS insulating layer and the forming a PMOS metal gate pattern.

3. The method of claim 1, further comprising, before the forming the NMOS and PMOS source/drain regions, forming an NMOS source/drain extension layer and a PMOS source/drain extension layer on sidewalls of the patterns for forming the NMOS and PMOS channels, respectively.

4. The method of claim 3, wherein the NMOS and PMOS source/drain extension layers are formed by selective epitaxial growth (SET).

5. The method of claim 1, wherein the sacrificial layer comprises silicon germanium (SiGe) and the NMOS and PMOS thin body channels comprise silicon.

6. The method of claim 5, wherein the preliminary layer for forming the channel comprises a first sacrificial layer, a first silicon layer, a second sacrificial layer, and a second silicon layer stacked sequentially.

7. The method of claim 5, wherein the preliminary layer for forming the channel comprises undoped silicon.

8. The method of claim 5, wherein the preliminary layer for forming the channel comprises N-doped silicon.

9. The method of claim 1, wherein the NMOS insulating layer comprises an $HfO_2$ layer.

10. The method of claim 9, further comprising, before the forming the NMOS insulating layer, forming an NMOS interface layer on a surface of the NMOS thin body channel.

11. The method of claim 10, wherein the NMOS interface layer comprises a silicon oxide layer, a silicon oxynitride layer, and/or a silicate layer.

12. The method of claim 1, wherein the PMOS insulating layer comprises an $Al_2O_3$ layer.

13. The method of claim 12, further comprising, before the forming the PMOS insulating layer, forming a PMOS interface layer on a surface of the PMOS thin body channel.

14. The method of claim 13, wherein the PMOS interface layer comprises a silicon oxide layer, a silicon oxynitride layer, and/or a silicate layer.

15. The method of claim 1, wherein the NMOS metal gate and the PMOS metal gate comprise identical materials.

16. The method of claim 15, wherein the NMOS metal gate and the PMOS metal gate comprise TiN.

17. The method of claim 1, wherein the NMOS metal gate and the PMOS metal gate comprise different materials.

18. The method of claim 1, wherein, in trimming the patterns for forming the NMOS and PMOS channels, edges of the sacrificial layer and the thin body channel layer of the patterns for forming the NMOS and PMOS channels are aligned.

19. A method of manufacturing a complementary metal-oxide semiconductor (CMOS) device, comprising:
    forming a preliminary layer for forming a channel on a semiconductor substrate in which an NMOS region and a PMOS region are defined, the preliminary layer including a sacrificial layer and a thin body channel layer;
    forming a first mask pattern defining an active region on the preliminary layer for forming a channel;
    etching the preliminary layer for forming the channel using the first mask pattern as an etch mask to form a preliminary pattern for forming an NMOS channel in the NMOS region and a preliminary pattern for forming a PMOS channel in the PMOS region;
    forming a second mask pattern on the preliminary patterns for forming NMOS and PMOS channels to expose both ends of the preliminary patterns for forming NMOS and PMOS channels and to define a channel region;
    anisotropically etching the preliminary patterns for forming the NMOS and PMOS channels until a surface of the semiconductor substrate is exposed using the second mask pattern as an etch mask to form a groove, thereby forming a pattern for forming the NMOS channel in the NMOS region and a pattern for forming the PMOS channel in the PMOS region;
    trimming the patterns for forming the NMOS and PMOS channels;
    forming an NMOS source/drain region and a PMOS source/drain region by filling the groove with a material layer after trimming the patterns for forming the NMOS and PMOS channels;
    forming a third mask pattern covering the NMOS and PMOS source/drain regions and exposing an upper surface of the pattern for forming the NMOS and PMOS channels;
    forming a fourth mask pattern covering the PMOS region;
    exposing a side of the pattern for forming the NMOS channel using the third mask pattern of the NMOS region as an etch mask;
    selectively removing a residual sacrificial layer of the pattern for forming the NMOS channel to form an NMOS thin body channel;
    forming an NMOS insulating layer on a surface of and surrounding the NMOS thin body channel;
    forming an NMOS metal gate pattern on and surrounding the NMOS insulating layer;
    removing the fourth mask pattern;
    forming a fifth mask pattern covering the NMOS region;
    exposing a side of the pattern for forming the PMOS channel using the third mask pattern of the PMOS region as an etch mask;
    selectively removing a residual sacrificial layer of the pattern for forming the PMOS channel to form a PMOS thin body channel;
    forming a PMOS insulating layer on a surface of and surrounding the PMOS thin body channel;
    forming a PMOS metal gate pattern on and surrounding the PMOS insulating layer; and
    removing the fifth mask pattern;
    wherein the NMOS insulating layer comprises a silicon oxide layer and the PMOS insulating layer comprises an electron-trapping layer, the NMOS insulating layer comprises a hole trapping dielectric layer and the PMOS insulating layer comprises a silicon oxide layer, or the NMOS insulating layer comprises a hole-trapping dielectric layer and the PMOS insulating layer comprises an electron-trapping dielectric layer; and
    wherein, in trimming the patterns for forming the NMOS and PMOS channels, the sacrificial layer and the thin body channel layer of the patterns for forming the NMOS and PMOS channels are simultaneously etched.

20. The method of claim 19, wherein, after the forming the preliminary patterns for forming the NMOS and PMOS channels, forming a shallow trench isolation layer in a portion of the semiconductor substrate on which the preliminary patterns for forming the NMOS and PMOS channels are not formed; and
    wherein the exposing a side of the patterns for forming the NMOS and PMOS channels comprises etching the shallow trench isolation layer.

21. The method of claim 19, further comprising forming an NMOS source/drain extension layer and a PMOS source/drain extension layer on sidewalls of the patterns for forming the NMOS and PMOS channels, respectively.

22. The method of claim 19, wherein the sacrificial layer comprises silicon germanium (SiGe) and the NMOS and PMOS thin body channels comprises silicon.

23. The method of claim 22, wherein the preliminary layer for forming the channel comprises undoped silicon.

24. The method of claim 22, wherein the preliminary layer for forming the channel comprises N-doped silicon.

25. The method of claim 22, wherein the second mask pattern comprises silicon oxide.

26. The method of claim 22, wherein the third mask pattern comprises silicon nitride.

27. The method of claim 19, wherein the NMOS insulating layer comprises an $HfO_2$ layer.

28. The method of claim 19, wherein the PMOS insulating layer comprise an $Al_2O_3$ layer.

29. The method of claim 19, wherein, in trimming the patterns for forming the NMOS and PMOS channels, edges of the sacrificial layer and the thin body channel layer of the patterns for forming the NMOS and PMOS channels are aligned.

* * * * *